United States Patent
Lee

(10) Patent No.: US 7,301,885 B2
(45) Date of Patent: Nov. 27, 2007

(54) LASER DIODE DRIVING CIRCUIT AND LASER DIODE CONTROLLING APPARATUS INCLUDING THE LASER DIODE DRIVING CIRCUIT

(75) Inventor: Sang-hyun Lee, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 552 days.

(21) Appl. No.: 10/912,055

(22) Filed: Aug. 6, 2004

(65) Prior Publication Data

US 2005/0030984 A1 Feb. 10, 2005

(30) Foreign Application Priority Data

Aug. 8, 2003 (KR) .................. 10-2003-0055024

(51) Int. Cl.
*G11B 7/00* (2006.01)

(52) U.S. Cl. .................. 369/120; 369/116

(58) Field of Classification Search ............... 369/120, 369/121, 122, 116, 47.5; 372/38.07
See application file for complete search history.

(56) References Cited

U.S. PATENT DOCUMENTS

| 5,138,623 A | * | 8/1992 | Ema et al. ............. 372/38.07 |
| 5,285,464 A | * | 2/1994 | Ogino ..................... 372/38.07 |

FOREIGN PATENT DOCUMENTS

| JP | 06-251371 | 9/1994 |
| JP | 09-147360 | 6/1997 |
| JP | 09-306011 | 11/1997 |
| JP | 10-312569 | 11/1998 |

\* cited by examiner

*Primary Examiner*—Nabil Hindi
(74) *Attorney, Agent, or Firm*—Roylance, Abrams, Berdo and Goodman, LLP

(57) ABSTRACT

A laser diode driving circuit and a laser diode controlling apparatus including the laser diode driving circuit. The laser diode driving circuit includes a voltage drop prevention unit, which prevents a voltage at an input terminal of the laser diode driving circuit from dropping to a predetermined voltage level or lower, the input terminal of the laser diode driving circuit being connected to an output terminal of the ALPC circuit.

4 Claims, 2 Drawing Sheets

LASER DIODE DRIVING CIRCUIT AND LASER DIODE CONTROLLING APPARATUS INCLUDING THE LASER DIODE DRIVING CIRCUIT

This application claims the benefit under 35 U.S.C. §119(a) of Korean Patent Application No. 2003-55024, filed on Aug. 8, 2003, in the Korean Intellectual Property Office, the disclosure of which is incorporated herein by reference in its entirety.

BACKGROUND OF THE INVENTION

1. Field of the Invention

The present invention relates to a laser diode driving circuit for an optical device and a laser diode controlling apparatus including the laser diode driving circuit. More particularly, the present invention relates to a laser diode driving circuit that protects a laser diode by preventing an excessive amount of laser diode driving current from being input to the laser diode and a laser diode controlling apparatus including the laser diode driving circuit.

2. Description of the Related Art

In general, no-touch optical apparatuses, such as CD and DVD readers and players, project light onto a disk by using a laser diode. The reflected light from the disk is converted into an electrical signal by using a light receiving diode, and the data from the disk is read by processing the electrical signal. The intensity of light incident on the light receiving diode needs to be maintained at a predetermined level so that the light reflected from the disk can be efficiently processed. For this, the power of the laser diode should also be maintained at a predetermined level, and this is why such no-touch optical apparatuses need a laser diode controlling apparatus.

FIG. 1 is a circuit diagram of a conventional laser diode controlling apparatus for controlling the power of a laser diode. Referring to FIG. 1, the conventional laser diode controlling apparatus includes an automatic laser power control (ALPC) circuit 110, which receives an output signal of a photodiode 101. The ALPC circuit 110 sets a reference voltage based on a variation in the intensity of the output signal of the photodiode 101, and outputs the reference voltage so that a stable optical power can be obtained. A laser diode driving circuit 120 outputs a current (hereinafter, referred to as laser diode driving current) for driving a laser diode 102 based on the reference voltage output from the ALPC circuit 110. A laser diode protecting circuit 130, which is installed between the laser diode driving circuit 120 and the laser diode 102, protects the laser diode 102 from static electricity or surge voltage possibly generated when installing a pickup unit 100 into or separating the pickup unit 100 from the conventional laser diode controlling apparatus. The pickup unit 100 preferably comprises the laser diode 102 and a photodiode 101.

In FIG. 1, a total of five nodes, that is, first through fifth nodes 1 through 5, are provided for the laser diode driving circuit 120. A bias point resistor R1 is disposed between the first and second nodes 1 and 2. In the laser diode driving circuit 120, a transistor Q constitutes an emitter follower amplifier. The base of the transistor Q is connected to the second node 2, the emitter of the transistor Q is connected to the fourth node 4, and the collector of the transistor Q is connected to the fifth node 5. A capacitor C1, which removes noise components, is disposed between the third and fourth nodes 3 and 4. The third node 3 is connected to a power supply voltage Vcc.

In a case where static electricity or surge voltage is generated, such as, when installing the pickup unit 100 into or separating the pickup unit from the conventional laser diode controlling apparatus, damage to the laser diode 102 can be prevented by charging or discharging the capacitor C2 and limiting the breakover voltage of a diode D1.

When the optical device operates, the base and emitter of the transistor Q preferably have predetermined voltages Vb and Ve, respectively. The voltages Vb and Ve are used as follows: Ve−Vb is approximately equal to 0.7 V, and (Vcc−Ve)/R2 is approximately equal to {Vcc−(0.7 V+Vb)}/R2 (where (Vcc−Ve)/R2 denotes current at the emitter of the transistor Q). The current at the base of the transistor Q is very low as compared to the current at the emitter of the transistor Q. Thus, the current at the collector of the transistor Q, which is the laser diode driving current, is substantially the same as the current at the emitter of the transistor Q.

However, if during the operation of the optical device, the base voltage of the transistor Q is lower than the target voltage level, the actual base voltage of the transistor Q is equal to Vb−Vs and the emitter current of the transistor Q is equal to {Vcc−(0.7 V+Vb−Vs)}/R2. The actual base voltage of the transistor Q is the voltage Vb' at the second node 2. Also, the target voltage may be lower that the target voltage level by as much as Vs due to static electricity, surge voltages, or other factors. Therefore, a current more than {Vcc−(0.7 V+Vb)}/R2 by Vs/R2 is supplied to the laser diode 102 as a laser diode driving current. The laser diode 102 may be damaged if the laser diode driving current is beyond the rated tolerance of the laser diode 102. The laser diode protecting circuit 130, which is disposed between the pickup unit 100 and the laser diode driving circuit 120, can protect, to some extent, the laser diode 102 from static electricity or a surge voltage that may be generated when installing the pickup unit 100 into or separating the pickup unit 100 from the conventional laser diode controlling apparatus. However, the laser diode protecting circuit 130 is still incapable of fully protecting the laser diode 102 from an excessive amount of driving current generated due to a decrease in the voltage of the base of the transistor Q during the operation of the optical device.

SUMMARY OF THE INVENTION

The present invention provides a laser diode driving circuit, which protects a laser diode by preventing an excessive amount of driving current from being supplied to the laser diode during the operation of an optical device.

The present invention also provides a laser diode controlling apparatus including a laser diode driving circuit.

According to an aspect of the present invention, there is provided a laser diode driving circuit that receives a reference voltage from an automatic laser power control (ALPC) circuit and outputs a laser diode driving current to a laser diode. The ALPC circuit sets and outputs the reference voltage. The laser diode driving circuit includes a voltage drop prevention unit, which prevents the voltage at an input terminal of the laser diode driving circuit from dropping to a predetermined voltage level or lower, the input terminal of the laser diode driving circuit being connected to an output terminal of the ALPC circuit.

According to another aspect of the present invention, there is provided a laser diode controlling apparatus that comprises an ALPC circuit, which sets and outputs a reference voltage, and a laser diode driving circuit, which receives the reference voltage from the ALPC circuit. The laser diode driving circuit outputs a laser diode driving current to a laser diode. The laser diode controlling apparatus includes a voltage drop prevention unit, which prevents the voltage at an input terminal of the laser diode driving circuit from dropping to a predetermined voltage level or lower. The input terminal of the laser diode driving circuit is connected to an output terminal of the ALPC circuit.

BRIEF DESCRIPTION OF THE DRAWINGS

The above and other features and advantages of the present invention will become more apparent by describing in detail an exemplary embodiment thereof with reference to the attached drawings in which.

It is understood that like reference numerals refer to like features and structures throughout the drawings.

DETAILED DESCRIPTION OF THE EXEMPLARY EMBODIMENTS

The exemplary embodiments of the present invention will now be described more fully with reference to the accompanying drawings, in which an exemplary embodiment of the invention is shown.

Figure 1:
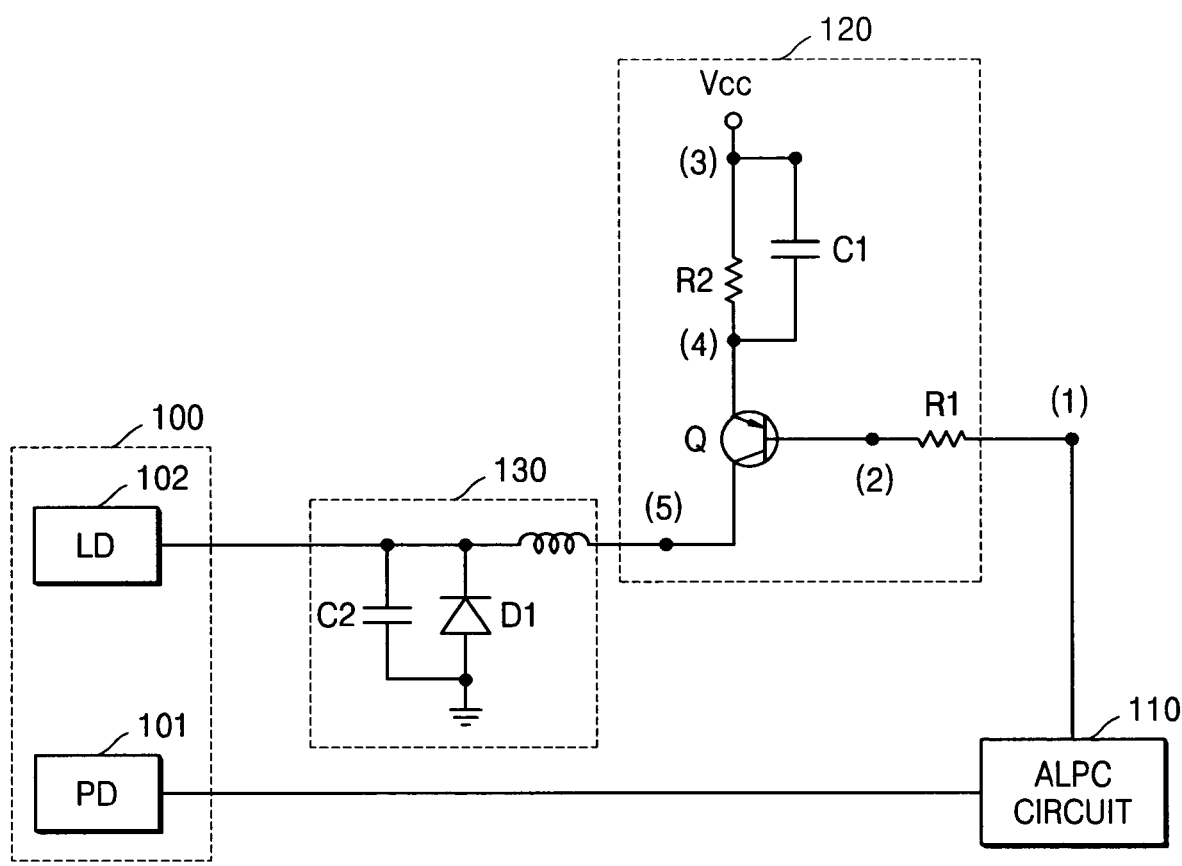
FIG. 1 is a circuit diagram of a conventional laser diode controlling apparatus for controlling the power of a laser diode.
Figure 2:
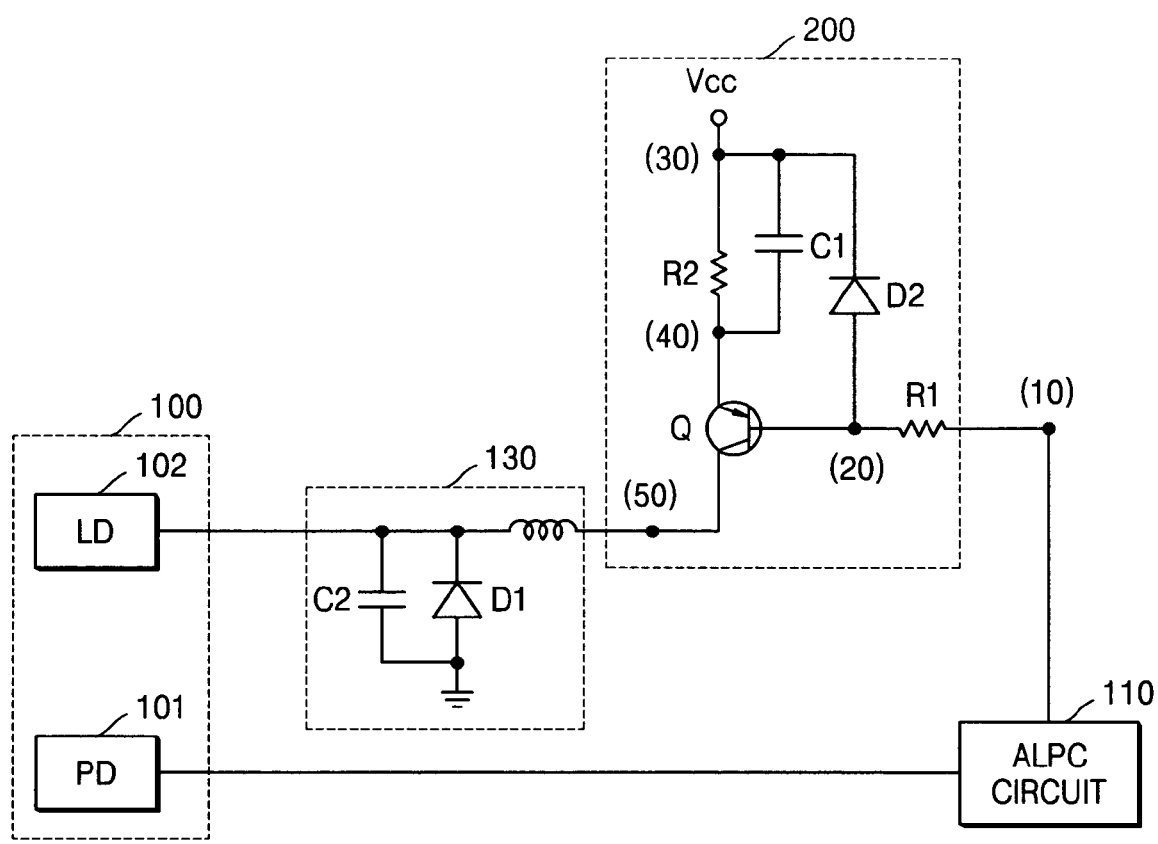
FIG. 2 is a circuit diagram of an example of a laser diode controlling apparatus according to an exemplary embodiment of the present invention.

FIG. 2 is a circuit diagram of a laser diode controlling apparatus according to an exemplary embodiment of the present invention. Referring to FIG. 2, the laser diode controlling apparatus includes an automatic laser power control (ALPC) circuit 110, which receives an output signal of a photodiode 101. The ALPC 110 preferably sets a reference voltage based on a variation in the intensity of the output signal of the light receiving diode 101. The ALPC 110 outputs the reference voltage Vd. A laser diode driving circuit 200 outputs a current for driving the laser diode 102 (hereinafter, referred to as a laser diode driving current) by referring to the reference voltage output from the ALPC circuit 110. A laser diode protecting circuit 130 can be installed at an output terminal of the laser diode driving circuit 200 to protect the laser diode 102 from static electricity or surge voltage that may be generated when installing the pickup unit 100 into or separating the pickup unit 100 from the laser diode controlling apparatus.

In the laser diode driving circuit 200, a total of five nodes, that is, first, second, third, fourth, and fifth nodes 10, 20, 30, 40, and 50, respectively, are disposed. The first node 10 is connected to the ALPC circuit 110, and the fifth node 50 is connected to the laser diode protecting circuit 130. A bias point resistor R1 is disposed between the first and second nodes 10 and 20. A transistor Q constitutes an emitter follower amplifier. A base of the transistor Q is connected to the second node 20, an emitter of the transistor Q is connected to the fourth node 40, and a collector of the transistor Q is connected to the fifth node 50. A capacitor C1, which removes noise components, is disposed between the third and fourth nodes 30 and 40.

A voltage regulating diode D2, which has a reference voltage Vd, is installed between the second and third nodes 20 and 30, i.e., between the base of the transistor Q and a power supply voltage Vcc. The voltage regulating diode D2 prevents a voltage at an input terminal of the laser diode driving circuit from dropping to a predetermined level or lower. The voltage regulating diode D2 is installed such that a direction from the third node 30 to the second node 20, that is, a direction from the power supply voltage Vcc to the base of the transistor Q, is a backward direction.

The operation of the laser diode controlling apparatus when the voltage regulating diode D2 is installed in the laser diode driving circuit 200 is as follows. When the optical device operates, the base and emitter of the transistor Q preferably have predetermined voltages Vb and Ve, respectively. The voltages Vb and Ve are used as follows: Ve−Vb is approximately equal to 0.7 V, and (Vcc−Ve)/R2 is approximately equal to {Vcc−(0.7 V+Vb)}/R2 (where (Vcc−Ve)/R2 denotes current at the emitter of the transistor Q). The current at the base of the transistor Q is very low as compared to the current at the emitter of the transistor Q. Thus, the current at the collector of the transistor Q, which is the laser diode driving current, is substantially the same as the current at the emitter of the transistor Q. The voltage, which is the reference voltage, across the voltage regulating diode D2 is Vd.

In some cases, an actual base voltage of the transistor Q is the voltage Vb' at the second node 20, which may be lower than the preferable target voltage level, Vb, when the optical device operates. This may be due to static electricity, surge voltage, or other factors. In a case where the actual base voltage Vb' of the transistor Q does not drop enough that the backward voltage Vcc−Vb' is lower than Vd, the static voltage regulating diode D2 is turned off and operates as if it were a open-circuit in the laser diode driving circuit 200. However, if the actual base voltage of the transistor Q drops so much that the backward voltage Vcc−Vb' becomes equal to the reference voltage Vd, the static voltage regulating D2 is turned on so that the actual voltage Vb' of the base of the transistor Q becomes equal to Vcc−Vd and can be prevented from dropping additionally. Accordingly, a minimum voltage Vbmin of the base of the transistor Q is equal to Vcc−Vd.

Therefore, a maximum value for the laser diode driving current can be determined by using the following equation: {Vcc−(0.7 V+Vbmin)}/R2={Vcc−(0.7 V+Vcc−Vd)}/R2= (Vd−0.7 V)/R2, and the laser diode driving current can be prevented from exceeding the maximum value.

As described above, according to an embodiment of the present invention, it is possible to set a maximum value for a laser diode driving current by preventing a voltage at an input terminal of a laser diode driving circuit from dropping to a predetermined voltage level or lower. Therefore, it is possible to prevent a laser diode from being damaged during its operation by an excessive amount of laser diode driving current.

What is claimed is:

1. A laser diode driving circuit that receives a reference voltage from an automatic laser power control (ALPC) circuit and outputs a laser diode driving current to a laser diode, the ALPC circuit setting and outputting the reference voltage, the laser diode driving circuit comprising:

a voltage drop prevention unit, which prevents a voltage at an input terminal of the laser diode driving circuit from dropping to or below a predetermined voltage level, the input terminal of the laser diode driving circuit being connected to an output terminal of the ALPC circuit.

2. The laser diode driving circuit of claim 1, wherein the voltage drop prevention unit is a voltage regulating diode, which is installed at the input terminal of the laser diode driving circuit and sets a maximum value for the voltage at the input terminal of the laser diode driving circuit.

3. A laser diode controlling apparatus that comprises an ALPC circuit, which sets and outputs a reference voltage, and a laser diode driving circuit, which receives the reference voltage from the ALPC circuit and outputs a laser diode driving current to a laser diode, the laser diode controlling apparatus comprising:

a voltage drop prevention unit, which prevents a voltage at an input terminal of the laser diode driving circuit from dropping to or below a predetermined voltage level, the input terminal of the laser diode driving circuit being connected to an output terminal of the ALPC circuit.

4. The laser diode controlling apparatus of claim 3, wherein the voltage drop prevention unit is a voltage regulating diode, which is installed at the input terminal of the laser diode driving circuit and sets a maximum value for the voltage at the input terminal of the laser diode driving circuit.

* * * * *